United States Patent [19]

Fandrich et al.

[11] Patent Number: 5,414,829
[45] Date of Patent: May 9, 1995

[54] OVERRIDE TIMING CONTROL CIRCUITRY AND METHOD FOR TERMINATING PROGRAM AND ERASE SEQUENCES IN A FLASH MEMORY

[75] Inventors: Mickey L. Fandrich, Placerville; Owen W. Jungroth, Sonora, both of Calif.

[73] Assignee: Intel Corporation, Santa Clara

[21] Appl. No.: 119,892

[22] Filed: Sep. 10, 1993

Related U.S. Application Data

[63] Continuation of Ser. No. 502,106, Mar. 29, 1990, abandoned.

[51] Int. Cl.⁶ .................... G06F 13/00; G06F 1/04; G11C 16/06
[52] U.S. Cl. ................... 395/425; 365/218; 365/900; 395/550; 364/DIG. 1
[58] Field of Search ............... 395/425, 550; 365/104, 365/185, 218, 189.05, 900, 226

[56] References Cited

U.S. PATENT DOCUMENTS

| | | | |
|---|---|---|---|
| 4,439,843 | 3/1984 | Takamatsu | 365/218 |
| 4,460,982 | 7/1984 | Gee et al. | 365/185 |
| 4,718,037 | 1/1988 | Thaden | 395/800 |
| 4,789,967 | 12/1988 | Liou et al. | 365/218 |
| 4,791,326 | 12/1988 | Vajdic et al. | 307/571 |
| 4,802,119 | 1/1989 | Heene et al. | 395/400 |
| 4,958,317 | 9/1990 | Terada et al. | 365/189.05 X |
| 4,970,692 | 11/1990 | Ali et al. | 365/218 |
| 5,034,922 | 7/1991 | Burgess | 365/189.07 |
| 5,043,940 | 8/1991 | Harari | 365/168 |
| 5,050,125 | 9/1991 | Momodomi et al. | 365/185 |
| 5,053,990 | 10/1991 | Kreifels et al. | 365/218 |
| 5,095,344 | 3/1992 | Harari | 365/185 |
| 5,097,444 | 3/1992 | Fong | 365/185 |
| 5,155,705 | 10/1992 | Goto et al. | 365/218 |
| 5,172,338 | 12/1992 | Mehrotra et al. | 365/185 |
| 5,222,046 | 5/1993 | Kreifels et al. | 365/218 |
| 5,297,148 | 3/1994 | Harari et al. | 371/10.2 |

OTHER PUBLICATIONS

"Logic Design and Computer Organization", by Morton H. Lewin, p. 128, Addison-Wesley, 1983.
*1989 Memory Components Handbook* of Intel Corporation, Santa Clara, Calif., (1988).

*Primary Examiner*—Glenn Gossage
*Attorney, Agent, or Firm*—Blakely, Sokoloff, Taylor & Zafman

[57] ABSTRACT

Override control circuitry and a method for terminating a sequence for erasing or programming a computer memory are described. A command register is provided for storing a command sent by an external processor to the memory. A decoder circuit decodes the command and outputs an erase or program set-up signal if the command indicates the initiation of an erase or program sequence. A latch is coupled to the decode circuit for storing the erase or program set-up signal. An override timer is located between the latch and the memory. The override timer includes a counter which is initialized and begins counting when the erase or program set-up signal is latched. The override timer also includes a circuit that detects when the counter has reached a first count for an erase sequence and a second count for a program sequence. The circuit then generates an erase or program override signal. An erase switch detects the erase override signal and prevents the application of an erase voltage to the memory. A program switch detects the program override signal and prevents the application of a program voltage to the memory. A voltage detector is also provided to terminate the erase or program sequences when the erase voltage or program voltage falls below a selected voltage level.

12 Claims, 10 Drawing Sheets

FIG_11

FIG_13

OVERRIDE TIMING CONTROL CIRCUITRY AND METHOD FOR TERMINATING PROGRAM AND ERASE SEQUENCES IN A FLASH MEMORY

This is a continuation of application Ser. No. 07/502,106, filed Mar. 29, 1990, now abandoned.

FIELD OF THE INVENTION

The present invention pertains to the field of computer memories. More particularly, this invention relates to circuitry and a method for generating a signal for terminating a sequence for erasing or programming a computer memory.

BACKGROUND OF THE INVENTION

One type of prior non-volatile computer memory is the flash erasable programmable read-only memory ("flash EPROM"). The flash EPROM can be programmed by a user, and once programmed, the flash-EPROM retains its data until erased. Electrical erasure of the flash EPROM erases the entire contents of memory of the device in one relatively rapid operation. The flash EPROM may then be programmed with new code.

One prior flash EPROM is the 28F256 Complementary Metal Oxide Semiconductor ("CMOS") Flash Memory sold by Intel Corporation of Santa Clara, Calif., which is a 256 Kilobit flash-EPROM. The 28F256 flash memory includes a command register to manage electrical erasure and reprogramming. Commands are written to the command register from a controlling microprocessor using standard microprocessor write timings. The command register contents serve as input to an internal state-machine that controls erase and programming circuitry.

On the 28F256 flash memory, a two-step sequence of operations is used to initiate erasure of the flash memory. First, a set-up erase operation is performed by writing the hexadecimal number 20 to the command register of the flash memory. The set-up erase operation is a command-only operation that stages the device for electrical erasure of all bytes in the memory array of the flash memory.

Second, the hexadecimal number 20 is again written to the command register, and this represents an erase command. An erase operation begins with the rising edge of the write-enable pulse that permits this erase command to be written to the command register.

The erase operation is terminated by the rising edge of the next write-enable pulse that accompanies the next command that is written to the command register. If the time between initiation and termination of the erase operation on the 28F256 flash memory is too long, the memory array can be damaged by the high voltage $V_{pp}$ that is applied to it for erasure due to the loss of too much charge. In other words, if the time between the rising edge of the write-enable pulse of the erase command and the rising edge of the write-enable pulse of the next command written to the command register is too long, the flash memory can be damaged.

On the 28F256 flash memory, programming is initiated by a program command that follows a program set-up command. The programming operation is terminated by the writing of subsequent command to the command register. If the time between initiation and termination of the programming operation on the 28F256 flash memory is too long, the flash memory can be damaged by the high voltage $V_{pp}$ used for programming due to the loss of too much charge.

One disadvantage of this prior flash memory is that the flash memory relies upon the controlling microprocessor to send the subsequent verify commands to end the respective erase and program operations, but sometimes the microprocessor either does not send the proper signal, or else sends the proper signal too late. The result is that the danger exists that the high voltage $V_{pp}$ will be applied to the flash memory for too long a time, possibly resulting in damage to the flash memory.

The controlling microprocessor might erroneously fail to terminate the erase operation or the programming operation for a number of reasons. For example, there might be a user software error in the algorithm for the controlling processor. As another example, a power failure might cause a processor execution error.

SUMMARY AND OBJECTS OF THE INVENTION

In view of the limitations of known circuitry and methods, one of the objectives of the present invention is to provide circuitry and a method wherein a controlling microprocessor is not the exclusive means for terminating an erase operation for a computer memory.

In view of the limitations of known circuitry and methods, one of the objectives of the present invention is to provide circuitry and a method wherein a controlling microprocessor is not the exclusive means for terminating a programming operation for a computer memory.

This and other objects of the invention are provided for by computer memory circuitry residing on a single substrate. The computer memory circuitry includes a memory. A first latch is provided for storing a command sent to the first latch by a processor. A second latch is coupled to the first latch for storing a first value when the command calls for an initiation of sequence for erasing the memory. A timer is coupled between the second latch and the memory. The timer includes a counter that begins counting when the first value is stored in the second latch. The timer also includes circuitry responsive to the counter for generating a signal for terminating the sequence for erasing the memory when the counter reaches a first count.

In addition, this and other objects of the invention are provided for by computer memory circuitry residing on a single substrate. The computer memory circuitry includes a memory. A first latch is provided for storing a command sent to the first latch by a processor. A second latch is coupled to the first latch for storing a first value when the command calls for an initiation of sequence for programming the memory. A timer is coupled between the second latch and the memory. The timer includes a counter that begins counting when the first value is stored in the second latch. The timer also includes circuitry responsive to the counter for generating a signal for terminating the sequence for programming the memory when the counter reaches a first count.

In addition, this and other objects of the invention are provided for by a method for terminating a sequence for erasing a computer memory. A command sent by a processor is stored in a first latch on the same substrate as the computer memory. A first value is stored in a second latch on the same substrate as the computer memory when the command calls for an initiation of the sequence for erasing the computer memory. A counter on the same substrate as the computer memory begins counting when the first value is stored in the second latch. A signal for terminating the sequence for erasing the computer memory is generated when the counter reaches a first count.

In addition, this and other objects of the invention are provided for by a method for terminating a sequence for erasing a computer memory. A command sent by a processor is stored in a first latch on the same substrate as the computer memory. A first value is stored in a second latch on the same substrate as the computer memory when the command calls for an initiation of the sequence for programming the computer memory. A counter on the same substrate as the computer memory begins counting when the first value is stored in the second latch. A signal for terminating the sequence for programming the computer memory is generated when the counter reaches a first count.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which:

FIG. 10 is a block diagram of the counter and match circuitry of the stop timer;

DETAILED DESCRIPTION

Figure 1:
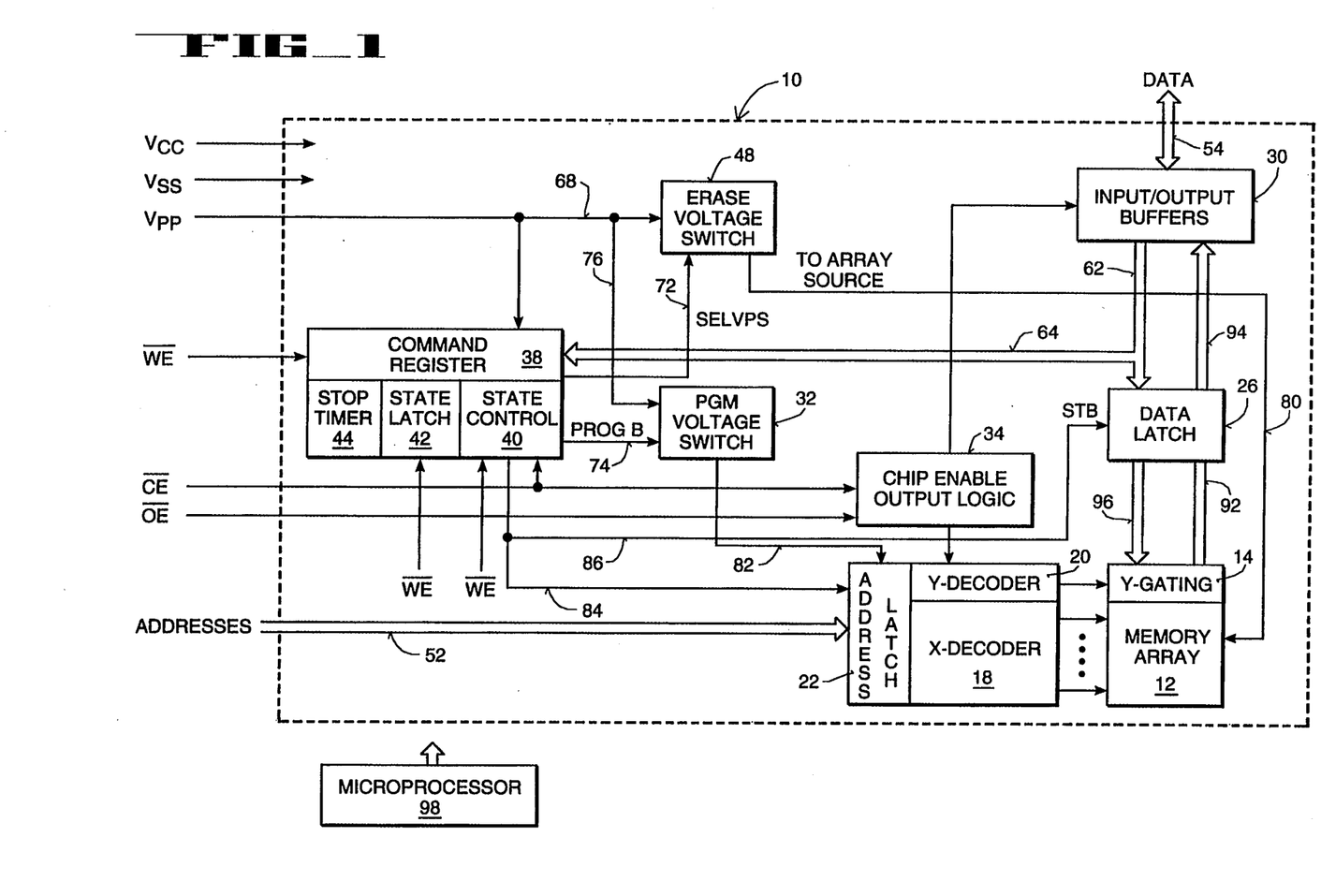
FIG. 1 is a block diagram of circuitry of a flash memory, including a memory array.

FIG. 1 illustrates in block diagram form the circuitry of flash EPROM 10, which implements a preferred embodiment of the present invention. Flash EPROM 10 is also referred to as flash memory 10. Flash memory 10 includes memory array 12, which includes memory cells that store data at addresses. In one embodiment of the present invention, memory array 12 can store 1,048,546 bits (i.e., one megabit) of information. Memory array 12 can, however, be larger or smaller. For example, memory array 12 can comprise 256 bits.

In a preferred embodiment, the circuitry of flash memory 10 shown in FIG. 1 is on a single substrate. In a preferred embodiment, flash memory 10 employs CMOS circuitry.

$V_{pp}$ is the erase/program power supply voltage for flash memory 10. $V_{cc}$ is the device power supply for flash memory 10 and $V_{ss}$ is ground. In one embodiment, $V_{pp}$ is 12.0 volts and $V_{cc}$ is approximately 5 volts.

In the absence of high voltage on the $V_{pp}$ input to flash memory 10, flash memory acts as a read-only memory. The data stored at an address supplied via lines 52 is read from memory array 12 and made available via lines 92, 94, and 54 to circuitry external to flash memory 10.

Flash memory 10 has two control functions that are coupled to chip enable output logic 34 chip-enable CE and output enable OE. Chip-enable input CE is the power control and is used to select flash memory 10. The output-enable input OE is the output control for flash memory 10 and should be used to gate data from the output pins from flash memory 10 independent of device selection. Both of the control functions CE and OE must be logically active to obtain data at the outputs of flash memory 10.

Flash memory also includes a command register 38, state control circuitry 40, state latch 42, and stop timer 44. Erasure and programming of flash memory 10 are accomplished via command register 38 when a high voltage $V_{pp}$ signal is applied to line 68. The contents of command register 38 serve as an input to state control circuitry 40, which acts as an internal state machine.

One of the outputs of state control circuitry 40 is an erase enable signal SELVPS, which is sent to erase voltage switch 48 via lines 72. Another output of state control circuitry 40 is a program enable bar signal PROGB that is sent to program voltage switch 32 via lines 74. Voltage $V_{pp}$ is applied to erase voltage switch 48 via line 68 and to program voltage switch 32 via lines 68 and 76.

When erase voltage switch 48 receives an erase enable signal via lines 72 that is a logical high, then erase voltage switch passes the erase power supply $V_{pp}$ from line 68 to memory array 12 via line 80. Erasure of memory array 12 then begins. Erasure of memory array 12 is an electrical erasure of all the cells in memory array 12. In one embodiment of the present invention, erasure of memory array is accomplished through the use of approximately 1000 separate pulses, each pulse lasting approximately 10 milliseconds. One or more erase verify commands are typically performed after each of the pulses.

If the erase enable signal SELVPS on line 72 is a logical low, then the erase power supply voltage $V_{pp}$ on line 68 is not passed to line 80, and therefore the voltage on line 80 is 0 volts. This terminates the erasure sequence of memory array 12.

When the program enable bar signal on lines 74 is a logical low, then the program voltage switch 32 passes the program voltage $V_{pp}$ on lines 68 and 76 through to line 82. The voltage $V_{pp}$ is thereby applied on line 82 and in turn to Y-decoder 20 and X-decoder 18. Y-decoder 20 is the column decoder for memory array 12 and X-decoder 18 is the row decoder for memory array 12. Data latch 26, bus 96, and Y-gating circuitry 14 are not described in more detail below.

The write-enable signal WE is coupled to command register 38, state latch 42, and state control circuitry 40. The write-enable signal controls writes to command register 38 and memory array 12. The write-enable signal is active low. Addresses are latched into address latch 22 on the falling edge of a write-enable pulse on line 84. Data is latched into data latch 26 on the rising edge of a write-enable pulse on line 86.

The command register 38 itself does not occupy an addressable memory location. Instead, command register 38 is a latch used to store the command along with the address and data information needed to execute the command.

Command register 38 is only alterable when voltage $V_{pp}$ is at a high voltage. In one embodiment of the present invention, a high voltage $V_{pp}$ is available only when memory updates are desired. When the high voltage is removed, the contents of command register 38 default to the read command, making the flash memory 10 a read-only memory.

In other embodiment of the present invention, a high voltage $V_{pp}$ is made constantly available to command register 38. In that instance, all operations of flash memory 10 are performed in conjunction with command register 38.

Command register 38 is written to by microprocessor 98, which controls flash memory 10. Command register 38 is written to by bringing the write-enable WE to a logic low level while the chip-enable signal CE is low. Addresses are latched on the falling edge of the write-enable pulse while data is latched on the rising edge of the write-enable pulse. The write-enable pulses are supplied by microprocessor 98. Standard microprocessor write timings are used in a preferred embodiment.

The three high-order register bits R7, R6, and R5 of command register 38 encode the control functions. All other register bits of command register 38 must be zero. Thus, the other register bits R4, R3, R2, R1, and R0 of command register 38 are zero. The only exception to this is the reset command. For the reset command, the hexadecimal number FF is written to command register 38.

The data to be loaded into registers R7 through R0 of command register 38 is supplied to flash memory 10 from microprocessor 98. That data is supplied via lines 54, 62, and 64 and via input/output buffers 30.

$V_{pp}/V_{cc}$ detector 152 checks the levels of voltages of $V_{pp}$ and $V_{cc}$. If either $V_{pp}$ or $V_{cc}$ or both are at a low level, then $V_{pp}/V_{cc}$ detector sends a signal via line 154 to command latches 38 in order to disable command latches 38. When a low voltage is supplied to the $V_{pp}$ pin, the contents of command register 38 default to the hexadecimal number 00, which enables only read-only operations.

Device operations are selected by writing specific data patterns into the command register via the data input lines 54, 62, and 64. Table 1 below defines certain commands for command register 38:

EVD in Table 1 represents the data read from the location EA during an erase verify operation. PA represents the address of a memory location to be programmed. PD represents data to be programmed at location PA. PVD represents data read from location PA during the program verify operation.

While $V_{pp}$ is high for erasure and programming, memory array 12 can be accessed via the read command. The read operation is initiated by writing 00 in hexadecimal into command register 38.

Figure 2:
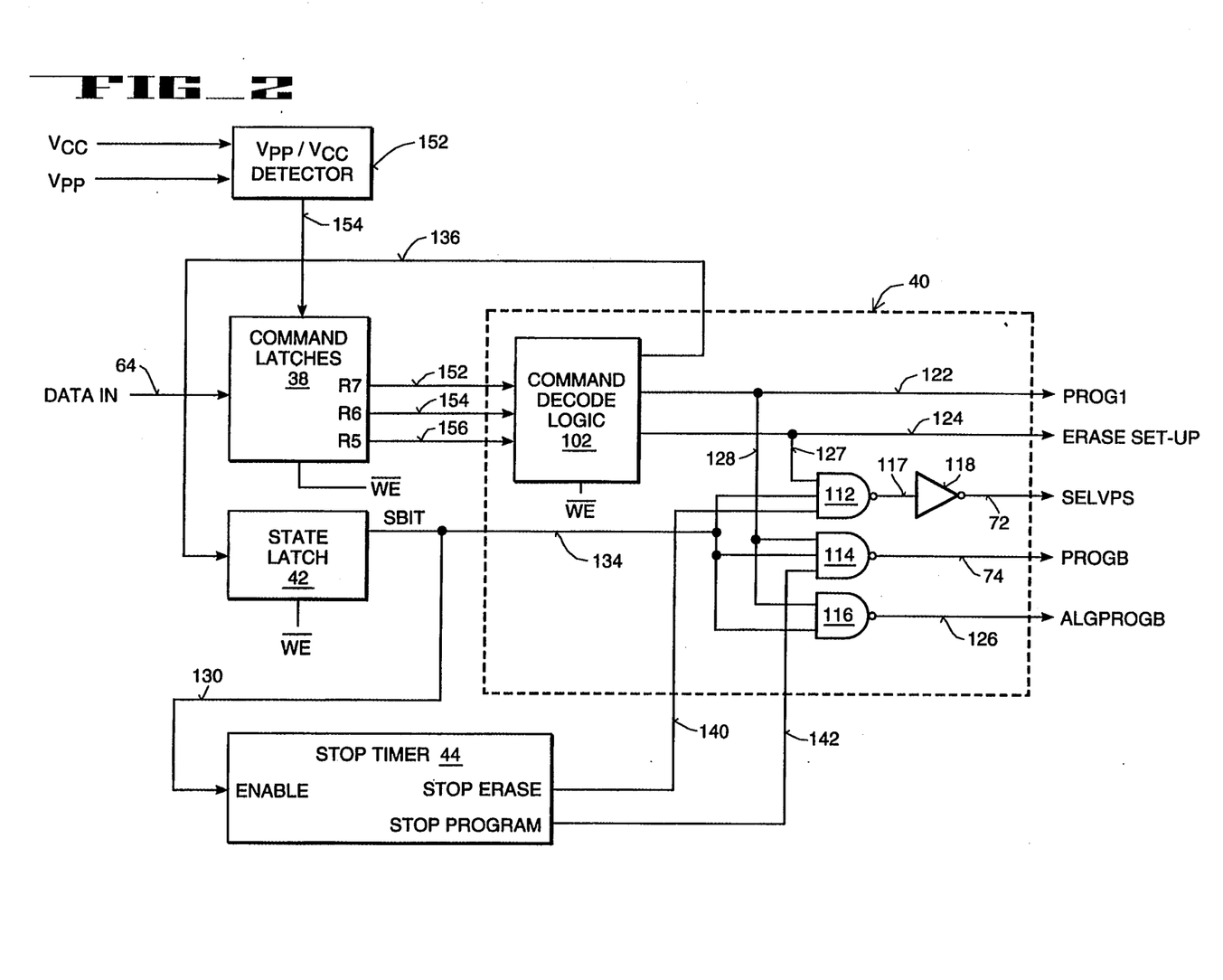
FIG. 2 is a block diagram of command latches, command decode logic, a state latch, and a stop timer of the flash memory.
Figure 3:
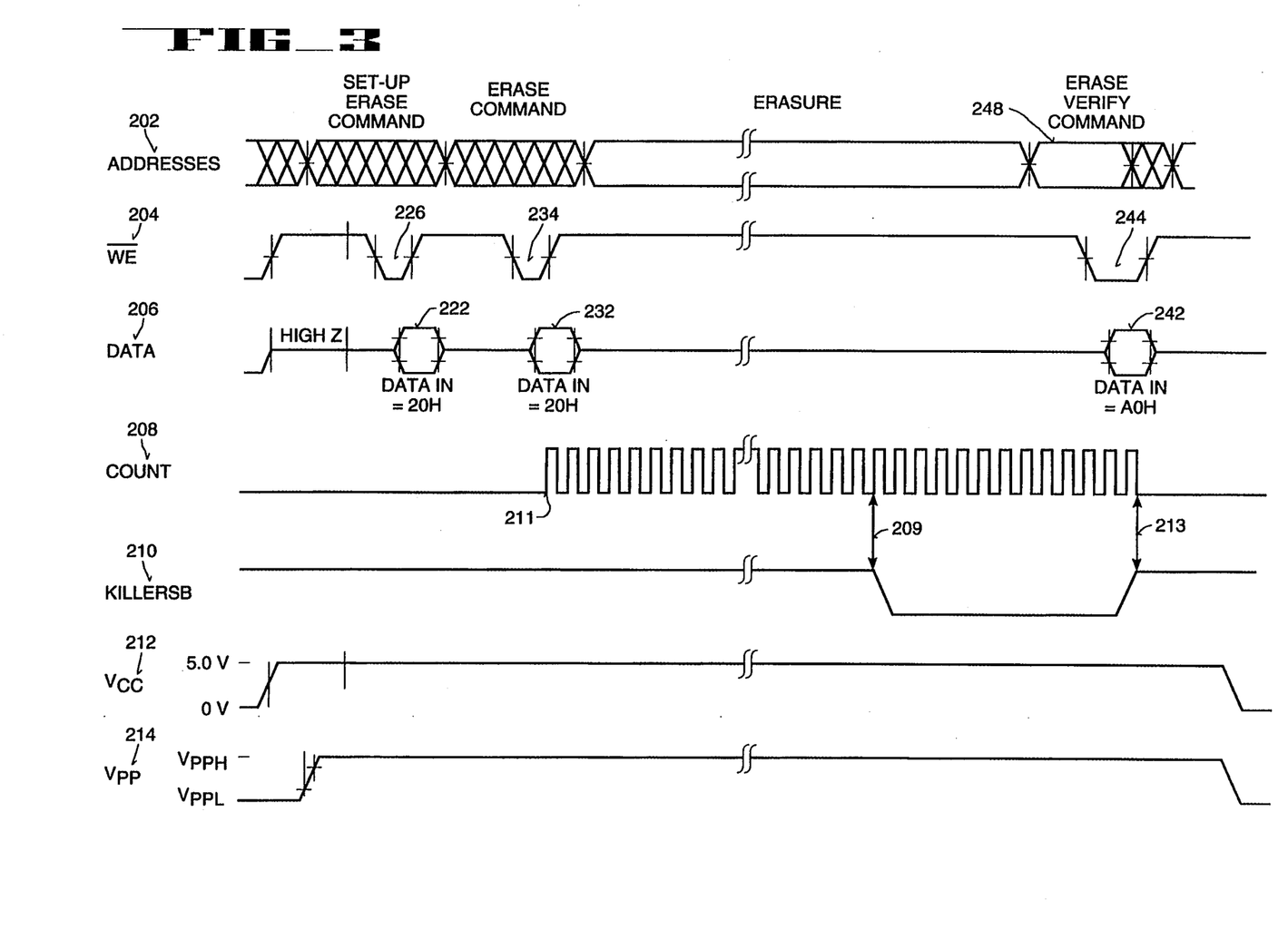
FIG. 3 illustrates certain waveforms associated with an erase operation for the flash memory.

FIG. 2 illustrates in more detail the interconnections between command register 38, stop timer 44, state latch 42, and certain circuitry that comprises a portion of state control circuitry 40. FIG. 3 illustrates address waveform 202, write-enable waveform 204, data waveform 206, count waveform 208, KILLERSB waveform 210, $V_{cc}$ waveform 212, and $V_{pp}$ waveform 214 associated with the erasure of flash memory 10.

In FIG. 2, eight bits of data are applied to command latches 38. Command latches 38 are also referred to as command register 38. The three high order bits of the data on lines 64 encode the control functions.

Lines 152, 154, and 156 couple the respective high order bits R7, R6, and R5 of command latches 38 to command decode logic 102 of state control circuitry 40. Command control logic 102 decodes the bits R7, R6, and R5 of command latches 38 and generates signals on line 136, 122, and 124.

A set-up erase operation is a command-only operation that stages flash memory 10 for electrical erasure of all bytes in memory array 12. The set-up erase operation is performed by writing the hexadecimal number 20 to command register 38. In FIG. 3, the hexadecimal number 20 is shown as data 222. The data 222 is latched into command latches 38 on the rising edge of write-enable pulse 226 of FIG. 3. As shown in FIG. 2, the write-enable signal 204 is input into command latches 38, command decode logic 102, and state latch 42.

Command decode logic 102 then decodes the data of bits R7, R6, and R5 of command latches 38. The command decode logic 102 interprets this as a set-up erase command. Command decode logic 102 then outputs a logical one onto line 136. That logical one is not yet latched into state latch 42. The latching of the data on line 136 into state latch 42 occurs upon the rising edge of the next write enable WE pulse.

Command decode logic 102 also sends out a logical one signal on line 124, which is the ERASE SET-UP signal. The erase enable signal SELVPS on line 72 remains a logical zero, however, because the SBIT signal on line 134 remains at a logical zero. The logical zero on line 134 is applied as an input to NAND gate 112. Therefore, NAND gate 112 produces a logical one signal on line 117, which is inverted by inverter 118 to a logical zero on line 72. The logical zero signal on line

TABLE 1

| Command | Bus Cycles Req'd | First Bus Cycle | | | Second Bus Cycle | | |
|---|---|---|---|---|---|---|---|
| | | Operation | Address | Data | Operation | Address | Data |
| Read Memory | 1 | Write | X | 00H | | | |
| Set-Up/Erase | 2 | Write | X | 20H | Write | X | 20H |
| Erase Verify | 2 | Write | EA | A0H | Read | X | EVD |
| Set-Up Program/ Program | 2 | Write | X | 40H | Write | PA | PD |
| Program Verify | 2 | Write | X | C0H | Read | X | PVD |
| Reset | 2 | Write | X | FFH | Write | X | FFH |

EA in Table 1 represents the address of the memory location to be read during an erase verify operation.

72 means that the erase voltage switch 48 remains closed, so a high voltage is not applied on line 80 to memory array 12. Thus, the logical signal on line 124 does not itself trigger erasure of memory array 12.

To commence erasure of memory array 12, the erase command—namely, the hexadecimal number 20—must again be written to command register 38. This writing the of hexadecimal number 20 to command latches 38 is shown as pulse 232 in FIG. 3. The erase operation begins with the rising edge of the write-enable pulse 234 of FIG. 3.

This two step sequence of set-up followed by execution helps to ensure that the contents of memory array 12 are not accidentally erased. In addition, chip-erasure can only occur when high voltage is applied to the $V_{pp}$ pin of flash memory 10. In the absence of this voltage, the contents of memory array 12 are protected against erasure.

The write-enable pulse 234 is also applied to state latch 42. This write-enable pulse 234 causes the logical one on line 136 to be latched into state latch 42. This causes line 134, which is coupled to state latch 42, to go to a logical one from a logical zero. The logical high on line 134 in turn is applied as a logical one input into NAND gate 112.

The other two inputs to NAND gate 112 are also in the logical one state. Command decode logic 102 continues to send out a logical one signal on erase set-up line 124 because command decode logic 102 continures to see the same binary data stored as bits R7, R6, and R5. In addition, the STOP ERASE signal on line 140 is in a logical high state.

Given that all three inputs to NAND gate 112 are in a logical one state, the output of NAND gate 112 on line 117 is a logical zero. Inverter 118 inverts that logical zero signal to a logical one on line 72. Therefore the erasure signal SELVPS becomes a logical one. Thus a logical one is sent on line 72 to erase voltage switch 48. This causes erase voltage switch 48 to close, and thus voltage $V_{pp}$ is passed through erase voltage switch 48 to line 80, which in turn applies that erase voltage $V_{pp}$ to memory array 12. As shown by the wave form 214 in FIG. 3, the erase voltage $V_{pp}$ is a logical high state (i.e., $V_{pph}$) during the set-up erase operation and the erase operation. The high voltage on line 80 starts to erase the bytes of memory array 12.

As discussed above, a logical one appears on line 134 when an erase command is received by command latches 38 after a set-up erase command is received by latches 38. The signal on line 134 is also referred to as the SBIT signal. The logical high SBIT signal is applied to the ENABLE input of stop timer 44 via line 130.

Stop timer 44 is used to terminate the electrical erasure operation with respect to memory array 12. Stop timer 44 is used to prevent "over erase" Stop timer 44 is also referred to as a "dead man timer."

A logical one applied to the enable input of stop timer 44 causes the counter within stop timer 44 to begin counting. FIG. 3 shows that at point 211 stop timer 44 begins counting. Point 211 is the point where a logical one appears on lines 134 and 130 of FIG. 2. The counter within stop timer 44 continues counting.

At point 209, the count reaches a certain count that represents that passage of a predetermined amount of time. For an erase operation, that amount of time is approximately 10 milliseconds, plus or minus approximately 0.5 milliseconds. That amount of time represents a conservative point at which to end the current erasure pulse. As discussed above, full erasure of memory array 12 requires approximately 1000 pulses of approximately 10 milliseconds each.

At that point 209, match circuitry within stop timer generates a logical zero STOP ERASE signal, which is placed on line 140 of FIG. 2. The STOP ERASE signal is active low and thus is normally at a logical high level. The STOP ERASE signal is also referred to as the KILLERSB or the KILL ERASE BAR signal. At point 209, the KILLERSB signal goes to a logical low level, as shown in FIG. 3.

A logical zero at line 140 is applied to NAND gate 112. This causes a logical one to be placed on line 117. Inverter 118 converts that logical one on line 117 to a logical zero on line 72. Therefore, line 72 applies a zero to erase voltage switch 48 which causes the erase voltage switch to open. This in turn causes the high voltage to be removed from line 80 and from memory array 12. The removal of the high voltage from memory array 12 means that the erase operation ends at approximately point 209.

Thus, stop timer 44 is started when the erase command is issued, and stop timer 44 terminates the current erase pulse after counting to the particular count reached at point 209. After point 209, the counter within timer 44 continues to count. After the counter within stop timer 44 reaches its maximum count, the counter rolls over and continues to count from zero. The counter within stop timer 44 only stops counting when it is disabled by the application of a logical zero signal to the ENABLE input to stop timer 44. This occurs at point 21 3 in FIG. 3. At point 213, the rising edge of write-enable pulse 244 causes the SBIT signal on lines 130 and 134 to go to the logical zero state. This in turn applies a logical zero to the ENABLE input to stop timer 44, thereby disabling stop timer 44. This causes the STOP ERASE output of stop timer 44 to return to its normal logic high state. This is shown by point 21 3 for waveform 210 in FIG. 3.

Thus, stop timer 44 of FIG. 2 provides a hardware mechanism located on flash memory 10 for terminating the erase sequence if the controlling microprocessor 98 fails to terminate the erase sequence in software. If the erase sequence operates too long, memory array 12 could be damaged. The provision of stop timer 44 on flash memory 10 helps to avoid the problem of the controlling processor 98 initiating an erase sequence but not terminating it. Such a failure to terminate the erase sequence by microprocessor 98 could be caused by user software errors in the algorithm in microprocessor 98 or by a processor execution error due to a power failure, for example.

Stop timer 44 is also indirectly controlled by $V_{pp}$ and $V_{cc}$. If $V_{pp}$ or $V_{cc}$ or both are low, then Vpp/Vcc detector 152 disables command latches 38. This in turn causes the SBIT signal on lines 130 and 134 to go to a logical zero state, which in turn means that a logical zero is applied to the enable input of stop timer 44, which means that stop timer 44 is disabled.

Any subsequent command written to command register 38 can, however, terminate the erase sequence for memory array 12 if that subsequent command is latched by the write-enable pulse applied to command register 38 before a logical low KILL ERASE BAR signal is generated by stop timer 44. This is because the write enable pulse associated with that subsequent command causes the SBIT signal on lines 130 and 134 to go to a logical zero. This means that the SELVPS signal goes to a logical low state. Thus, the erase sequence will be terminated by whichever happens first—either a logical low KILL ERASE BAR signal or a logical low SBIT signal.

The erase command erases all bytes of memory array 12 in parallel. After each erase operation, all bytes of memory array 12 should be verified. An erase verify operation is initiated by writing the hexadecimal number A0 into command register 38. This is indicated by data waveform 242 in FIG. 3. The address for the byte to be verified should also be supplied to lines 52 of flash memory 10 by controlling microprocessor 98. The supplying of the byte address to line 52 is indicated by waveform 248 in FIG. 3. The byte address associated with the erase verify command is latched in address latch 22 of flash memory 10 on the falling edge of write-enable WE pulse 244 of FIG. 3. If stop timer 44 has not yet generated a logical low KILL ERASE BAR signal, then the writing the erase verify command to command register 38 terminates the erase operation upon the rising edge of the write-enable pulse 244.

Flash memory 10 applies an internally-generated margin voltage to the addressed byte. Reading the hexadecimal number FF from the addressed byte indicates that all bits in the byte are erased.

The erase-verify command should be written to the command register 38 prior to each byte verification to latch its address. The process continues for each byte in memory array 12 until a byte does not return the hexadecimal number FF as data or until the last address of memory army 12 is accessed.

In the case where the data read is not the hexadecimal number FF, another erase operation is performed. Verification then resumes from the address of the last-verified byte. Once all bytes in memory array 12 have been verified, the erase step is complete. Flash memory 10 can then be programmed. At this point, the verify operation is terminated by writing a valid command to the command register 38.

Stop timer 44 also includes a STOP PROGRAM output that can terminate a programming operation. The STOP PROGRAM output of stop timer 44 is also referred to as the KILLPRGMB or KILL PROGRAM BAR output. The KILLPRGMB output of stop timer 44 is active low and thus normally is in the logical high state.

The steps for programming memory army 12 are as follows.

The set-up program operation is a command-only operation that stages flash memory 10 for byte programming. Writing the hexadecimal number 40 into command register 38 performs the set-up operation. The writing of the hexadecimal number 40 as data is shown by waveform 322 in FIG. 4. The hexadecimal number 40 is latched into command register on the rising edge of write-enable pulse 326.

Command decode logic 102 reads the high-order bits R7, R6, and R5 of command register 38 after the hexadecimal number 40 is latched into command latches 38. Command decode logic 102 decodes bits R7, R6, and R5. As a result, the command decode logic 102 places a logical high signal on line 136. That logical high signal is not yet latched by state latch 42 because state latch 42 has not yet received a write-enable pulse to do so.

Command decode logic 102 also places a logical high PROG1 signal on line 122. The PROG1 signal is also referred to as the program set-up signal. The logical high PROG1 signal on line 122 is also applied via line 28 as an input to NAND gate 114 and as an input to NAND gate 116.

Another input to NAND gate 114 is the SBIT signal, but at that point in time the SBIT signal has a logical low value. The third input to NAND gate 114 is the STOP PROGRAM signal applied from stop timer 44 via line 142. At that point in time, the STOP PROGRAM signal is logically high. Given all the inputs to NAND gate 114, the PROGB signal on line 74 is logically high. The PROGB signal is also referred to as the program enable signal. The PROGB signal is applied to program voltage switch 32 via line 74. A logically high PROGB signal means that program voltage switch 32 remains open and that the voltage Vpp is not applied to X-decoder 18 and Y-decoder 20 via line 82.

Once the program set-up operation is performed, the next write-enable pulse 334 initiates an active programming operation. Addresses applied to lines 52 of flash memory 10 are latched in address latch 22 on the falling edge of write-enable pulse 334. The addresses latched are shown by waveform 352 of FIG. 4. The data on lines 64 comprising the program command is latched into command register 38 on the rising edge of the write-enable pulse 334. The data of the program command is shown by waveform 332 in FIG. 4.

The rising edge of write-enable pulse 334 also begins the programming operation. This happens as follows. The rising edge of write-enable pulse 334 also latches the logical high signal on line 136 into state latch 42. This causes the SBIT signal on lines 130 and 134 to become logically high. The logical high SBIT signal on line. 134 is applied as one of the inputs to NAND gate 114. At that point in time, the other two inputs to NAND gate 114 are also each logically high. This means that the PROGB signal on line 74 becomes a logic low signal. This logic low PROGB signal is applied to program voltage switch 32 via line 74 and causes the program voltage switch 32 to close. The closing of program voltage switch 32 causes power supply voltage Vpp to be applied to X-decoder circuitry 18 and Y-decoder circuitry 20, which in turn allows memory array 12 to be programmed.

The fact that the SBIT signal on line 130 becomes logically high means that the ENABLE input to stop timer 44 becomes logically high. The ENABLE input to stop timer 44 becomes logically high at point 311 in FIG. 3 and this causes stop timer 44 to begin counting at point 311. The counter circuitry within stop timer 44 continues counting, and at point 309 the match circuitry within stop timer 44 causes the KILLPGMB output of stop timer 44 to go to the logical low state. This is shown as waveform 310 in FIG. 3.

Point 309 is chosen such that a predetermined amount of time passes for the current programming pulse. In a preferred embodiment, the predetermined amount of time is 10 to 25 microseconds for each programming pulse. The 10 to 25 microsecond programming pulses must be repeated a relatively large number of times before the entire memory array 12 is fully programmed.

The logical low KILLPGMB signal is applied as an input to NAND gate 114 via line 142. This causes the PROGB signal on line 74 attached to the output of NAND gate 114 to go from the logical low state to the logical high state. The logical high PROGB signal is applied to program voltage switch 32 via line 74, and this causes the program voltage switch 32 to open. The opening of the program voltage switch 32 terminates the programming sequence because the high voltage Vpp voltage is no longer applied to X-decoder 18 and Y-decoder 20. Stop timer 44 continues counting until point 313 of FIG. 3.

Thus, stop timer 44 can terminate the programming operation. Thus, flash memory 10 does not have to exclusively rely on microprocessor 98 to terminate the programming operation. This helps to avoid having the programming operation inadvertently last too long, which possibly could damage flash memory 10.

Any subsequent command written to command register 38 can, however, terminate the programming operation if that subsequent command is latched into command register 38 by a write-enable pulse before stop timer 44 generates a logical low STOP PROGRAM signal. This is because the write-enable pulse associated with that subsequent command causes the SBIT signal on lines 130 and 134 to go to the logical zero state. A logical low SBIT means that the PROGB signal becomes logically high. Therefore, a programming operation will be terminated by whichever happens first—either a logical low KILL PROGRAM BAR signal or a logical low SBIT signal.

Flash memory 10 is programmed on a byte-by-byte basis. Byte programming may occur sequentially or at random. Following each programming operation, the byte just programmed should be verified.

The program-verify operation is initiated by writing the hexadecimal number C0 into command register 38. This hexadecimal data C0 is shown by waveform 342 in FIG. 3. The program-verify command terminates the programming operation at the rising edge of write-enable pulse 344 if a logical low KILL PROGRAM BAR signal has not been generated by that point by stop timer 44. The program-verify operation stages flash memory for verification of the byte last programmed. No new address information is latched by address latch 22.

Figure 4:
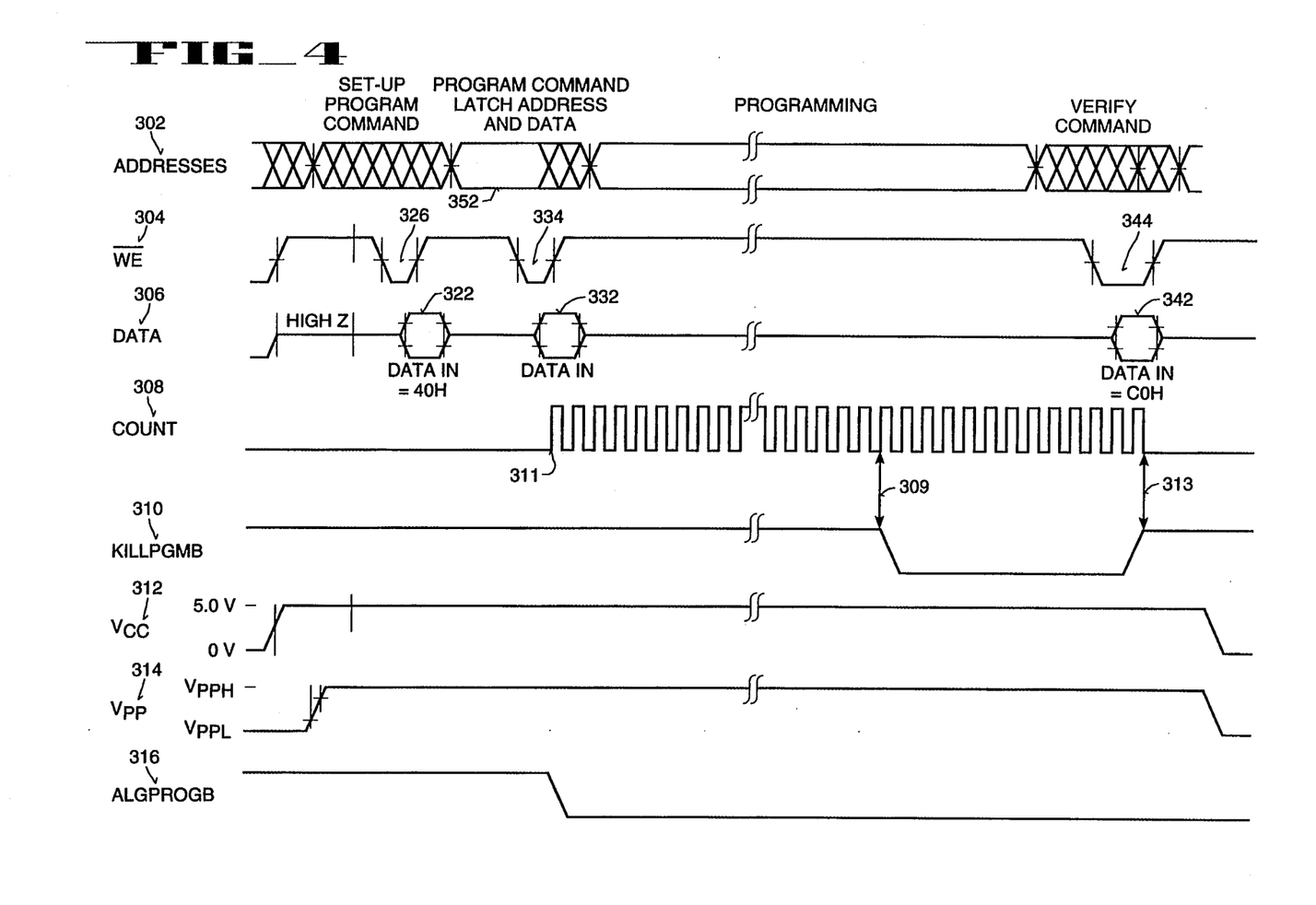
FIG. 4 illustrates certain waveforms associated with a programming operation for the flash memory.

The function of the ALGPROGB signal on line 126 of FIG. 2 is to prevent new address information from being latched by address latch 22 during the program-verify operation. The ALGPROGB signal is an active low signal. The ALGPROGB signal is also referred to as the ADDRESS LATCH GENERATOR PROGRAM BAR signal. During the program-verify operation, both inputs to NAND gate 116 will be logically high—the PROG1 signal is logically high and the SBIT signal is logically high. Therefore, the ALGPROGB signal on line 126 coupled to the output of NAND gate 116 will be logically low. The logical low ALGPROGB signal is sent to the address latch generator in order to prevent a new address from being latched by address latch 22 during the program-verify operation. Thus, even though the stop timer 44 signal KILLPGMB places the rest of flash memory 10 into program standby wherein PROG1 is active, the address latch generator will remain in the program state, and the program-verify command will not open address latch 22. The ALGPROGB waveform 316 is shown in FIG. 4.

Flash memory 10 applies an internally-generated margin voltage to the byte. A read cycle of microprocessor 98 outputs the data. A successful comparison between the programmed byte and the true data means that the byte is successfully programmed. Programming then proceeds to the next desired byte location.

With the circuit of FIG. 2, the PROG1 and ERASE SET-UP signals are not affected by the outputs of stop timer 44. Therefore, flash memory 10 will remain in the program set up or erase set up state if stop timer 44 disables the program or erase sequence. This has the desired affect of leaving flash memory 10 in a state compatible with the program and erase algorithms.

Figure 5:
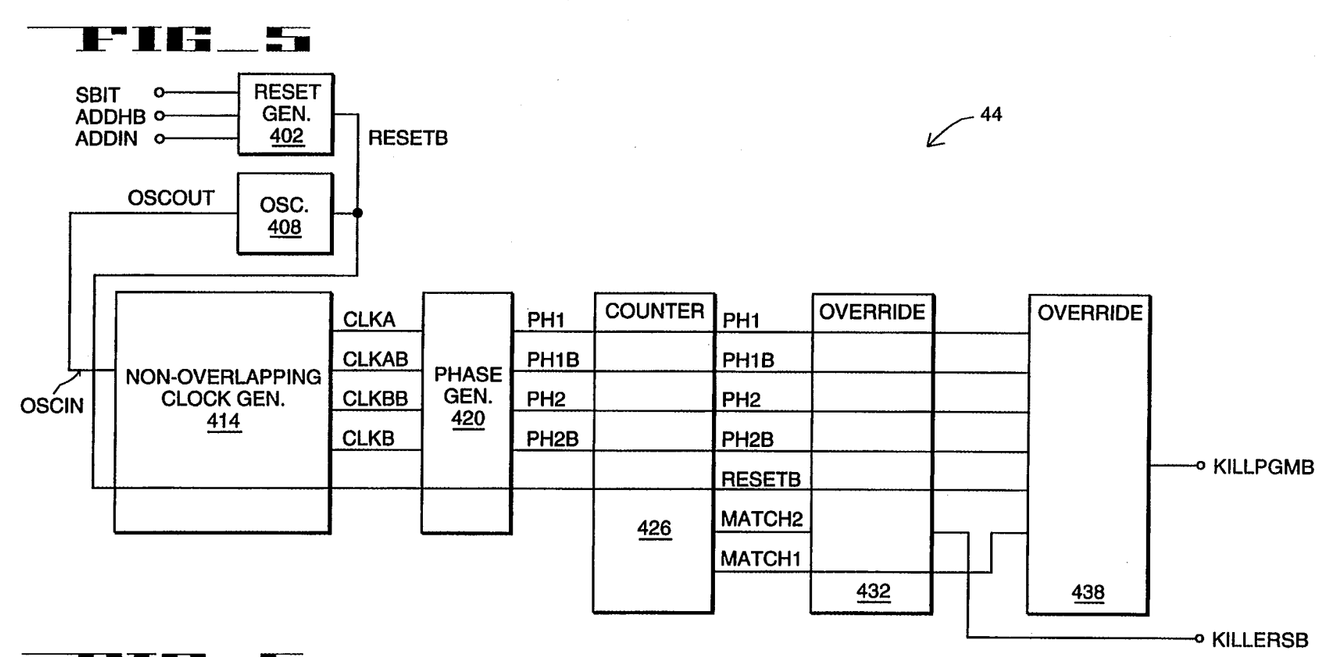
FIG. 5 is a block diagram of circuitry of the stop timer.

FIG. 5 illustrates in block diagram form the circuitry of stop timer 44. Stop timer 44 is comprised of reset generator 402, oscillator 408, non-overlapping clock generator 41 4, phase generator 420, counter 426, override circuitry 432, and override circuitry 438.

The input signals to stop timer 44 are the SBIT signal, an ADDHB signal, and a ADDIN signal. The ADDHB and ADDIN signals are used only in testing flash memory 10. The output signals for stop timer 44 are the KILLPGMB signal and the KILLERSB signal.

Stop timer 44 is built in a modular fashion, with a current-controlled ring oscillator 408 providing the clock stimulus for the remaining blocks. Oscillator 408 is held in a steady state until the SBIT signal is active (or, if flash memory 10 is in the test mode, until the ADDHB and ADDIN signals are active). Once the SBIT signal (or the ADDHB/ADDIN signal) is active, the oscillator 408 generates an OSCOUT oscillator output that toggles at the frequency sent by the ring circuit. The OSCOUT output of oscillator 408 drives a NAND non-overlapping generator 414.

Non-overlapping clock generator 414 generates non-overlapping clocks that are applied to phase generator 420, which is the next stage. The phase generator phase 420 includes a two-bit shift register that is held in the "00" state until the SBIT signal is activated. The shift register shifts through four combinations—namely, "00," "01," "11," and "10." Two decoders of phase generator 420 watch for the "01" and "10" states, and generate two output clocks—namely, PH1 and PH2, respectively. These PH1 and PH2 clocks serve as the controlling clocks for the 15 bit counter 426 and the circuits 432 and 438 that generate the program and erase override signals.

Figure 6:
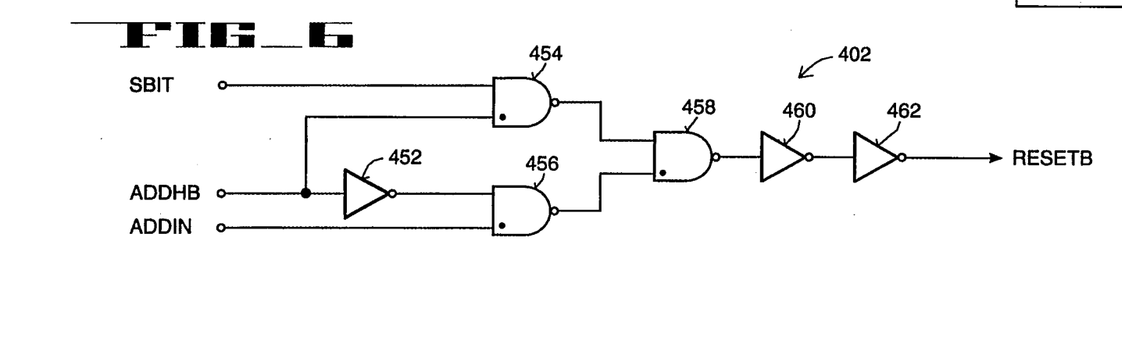
FIG. 6. is an electrical schematic of a reset generator of the stop timer.

FIG. 6 illustrates reset generator 402. Reset generator 402 generates a signal RESETB that is used to force all nodes in the stop timer 44 to a known state. All nodes in oscillator 408 are forced, as are all of the data latches, clocks, and match circuits of stop timer 44.

Reset generator 402 is a two-to-one multiplexer realized in two level logic comprised of NAND gates 454, 456, and 458. Invertors 460 and 462 amplify the RESETB signal given that the RESETB output drives all of the other blocks in stop timer 44.

The SBIT signal comes from state latch 42. The ADDHB and ADDIN input signals are only used in a test mode for flash memory 10. The ADDHB signal comes from a high voltage detector. The ADDIN signal comes from an address pin the flash memory. When the ADDHB signal is a logical high (i.e., inactive), then the SBIT signal controls the RESETB signal—that is, when SBIT is low, RESETB is low, and when SBIT is high, RESETB is high. When ADDHB is low (i.e., active), then the ADDIN signal controls RESETB. ADDHB is low only during test modes.

Figure 7:
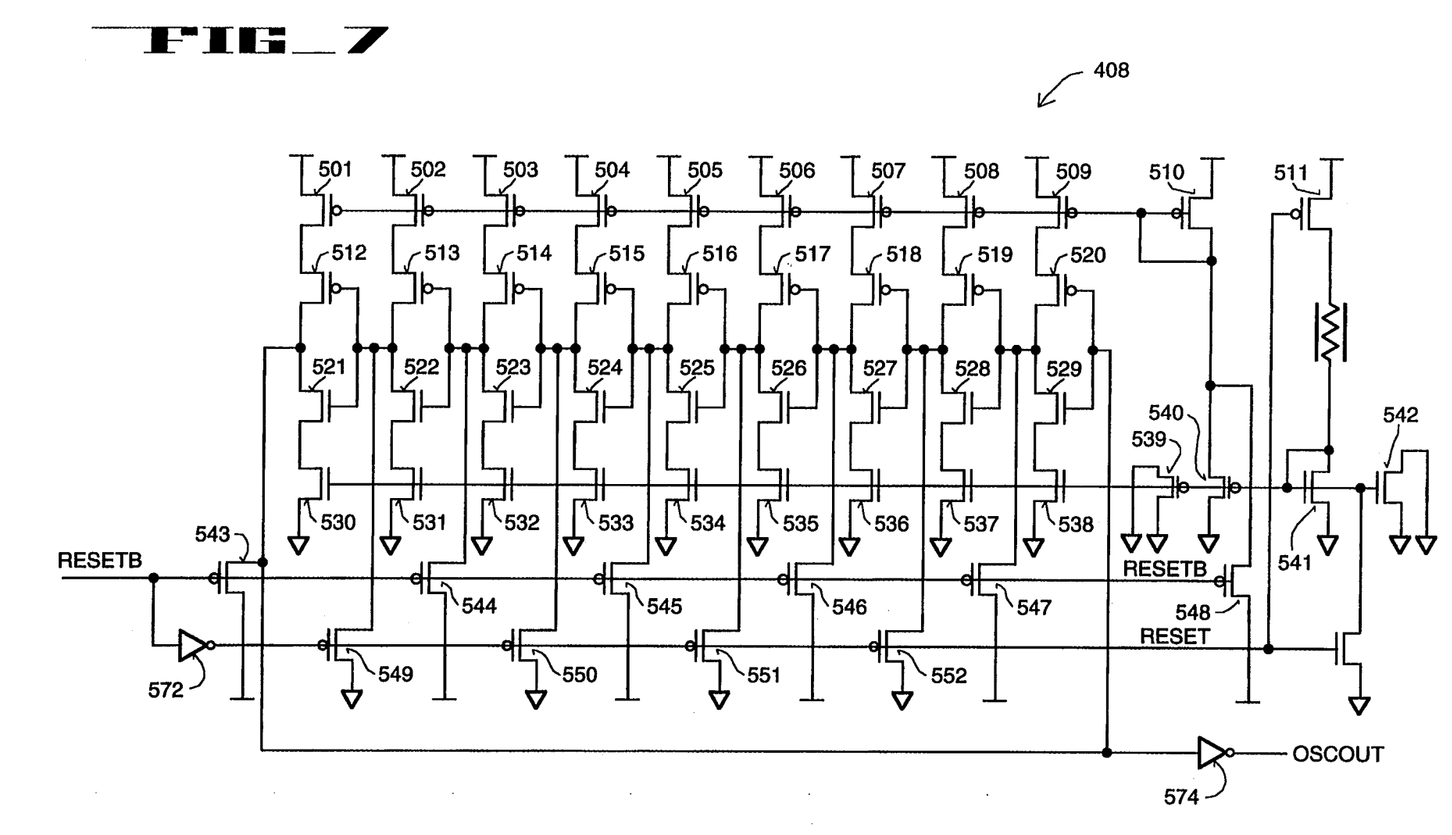
FIG. 7 is an electrical schematic of oscillator circuitry of the stop timer.

FIG. 7 illustrates the circuitry of oscillator 408. Oscillator 408 is a current-controlled ring oscillator comprised of transistors 501 through 548 and inverters 572 and 574. When flash memory 10 is not in the test mode, oscillator 408 is held in a steady state until the SBIT signal is active. When oscillator 408 is taken out of the steady state mode, then the OSCOUT signal toggles at a frequency set by the ring circuit of oscillator 408.

Figure 8:
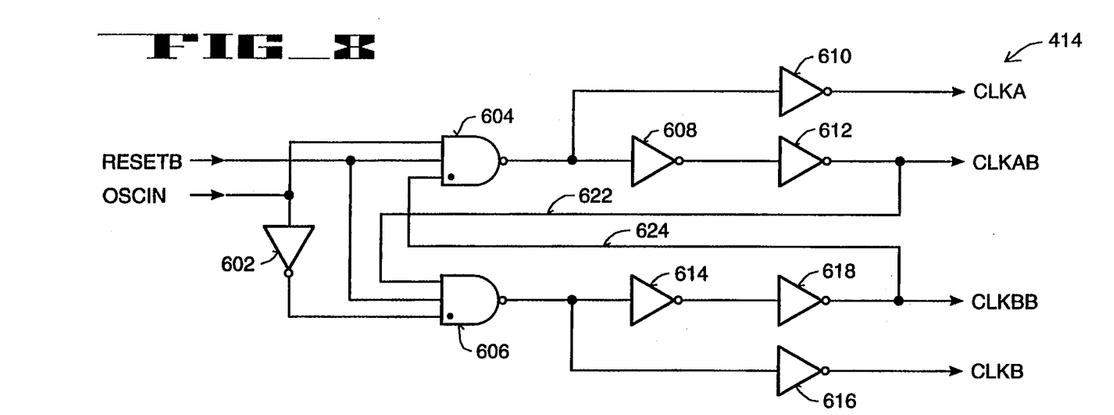
FIG. 8 is an electrical schematic of a non-overlapping clock generator of the stop timer.

FIG. 8 illustrates the circuitry of non-overlapping clock generator 414. The inputs to non-overlapping clock generator 41 4 are the RESETB signal and an OSCIN signal. The OSCIN signal is simply the OSCOUT signal from oscillator 408.

Non-overlapping clock generator 414 takes the OSCOUT signal from oscillator 408 and derives two non-overlapping clocks—namely, CLKA and CLKB—and their logical complements (i.e., CLKAB and CLKBB). Non-overlapping clock generator employs a standard NAND-NAND circuit that uses NAND gates 604 and 606, and inverters 602, 608, 612, 614, and 618. Feedback from the outputs back to the opposite inputs is provided by lines 622 and 624. This guarantees that one output will have to be within one Vt of its inactive state before the other output can become active.

The outputs of non-overlapping generator 414 drive only the phase generator 420, so the output drivers are relatively small. When RESETB is active, all of the outputs of non-overlapping generator 414 are inactive, with outputs CLKA and CLKB at a logical zero, and CLKAB and CLKBB are at a logical one.

Figure 9:
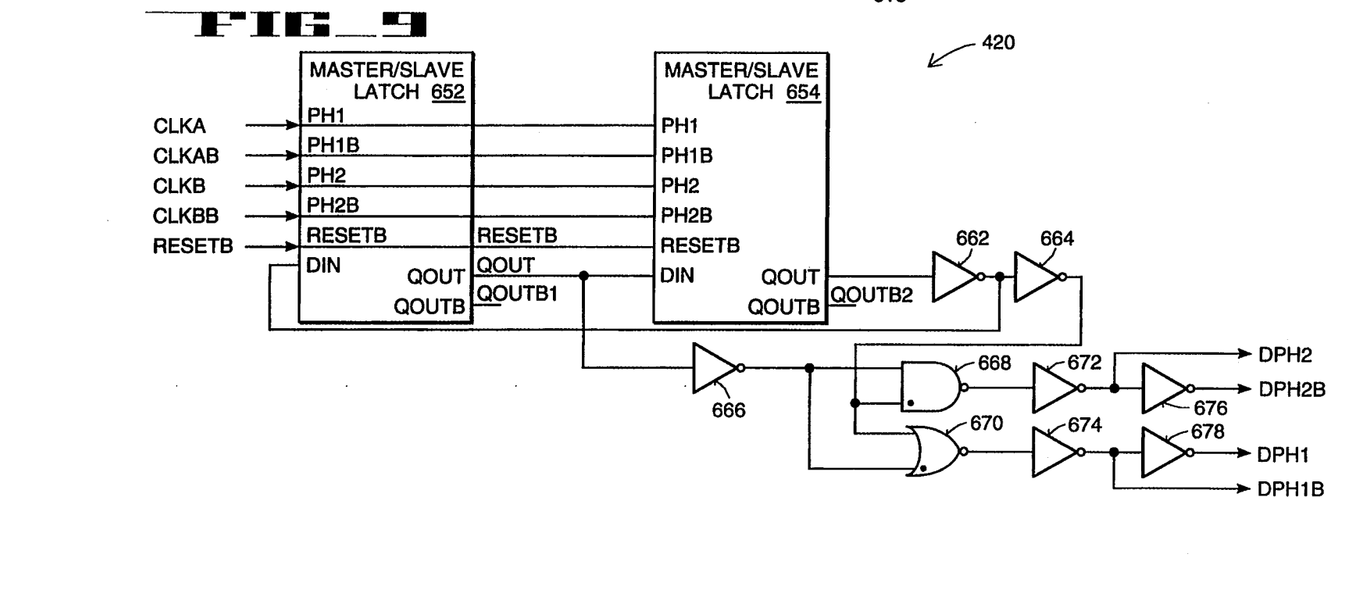
FIG. 9 is an electrical schematic of a phase generator for the stop timer.

FIG. 9 illustrates the circuitry of divide-by-four phase generator 420. Phase generator 420 includes a two-bit shift register comprised of master/slave latches 652 and 654. Clocks DPH1 and DPH2 are generated by the decoding circuitry of phase generator 420, and so are their complements DPH1B and DPH2B.

Phase generator 420 effectively divides the output of oscillator 408 by four as phase generator 420 counts through its sequence. When RESETB is active, the shift register comprised of latches 652 and 654 is reset to "00." After RESETB is deactivated, the shift resister begins to cycle through its sequence—namely, "00," "01," "11," and "10." Two of the cycles, "01" and "10," are detected by the output decoding circuitry and are used to generate signals DPH1 and DPH2, respectively. Devices 668, 672, and 676 generate signals DPH2 and DPH2B. Devices 670, 674, and 678 generate DPH1 and DPH1B. Devices 662, 664, and 666 amplify the outputs of latches 652 and 654. When RESETB is active, all of the clock outputs are inactive.

FIG. 10 illustrates in block diagram form the circuitry of counter 426 of stop timer 44. Counter 426 is built as a 15 bit shift register comprised of data latches 701 through 715 with XNOR feedback provided by XNOR gate 728 on the last two bits (i.e., the most significant bits) back to the input. Counter 426 counts in a non-linear fashion, but counter 426 can count to its maximum value of 32,768.

The master half of the latches are loaded in DPH1, and the data in the master is transferred to the slave during DPH2. Thus, the counter outputs become valid during DPH2 and are held until the next DPH2. All counter bits are reset to a logical zero during RESETB active.

Figure 11:
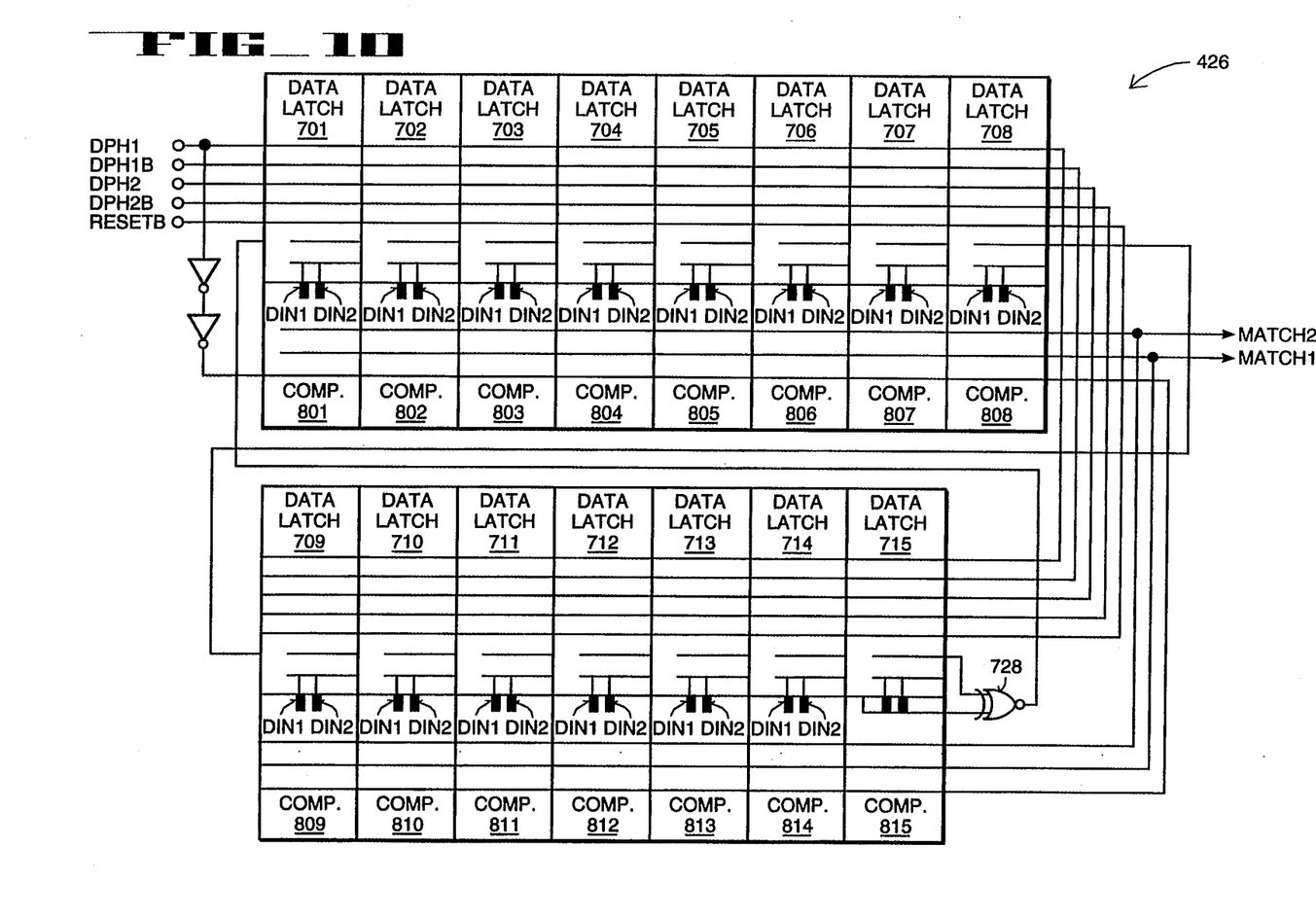
FIG. 11 is an electrical schematic of circuitry of a data latch used in the stop timer.

FIG. 11 illustrates the circuitry of data latch 722, which is an example of one of the data latches 701 through 715 used in counter 426 of FIG. 10. Data latch 722 is a master-slave design, with an asynchronous active low reset into both the master and slave portions of the latch. The input stage of each portion of the latch is a tri-statable inverter made up of transistors 752, 754, 756, and 758. The tri-statable inverter serves to isolate the latch itself from input parasitics, as well as to reduce contention between the feedback device and the input driver. The p/n pass gate pair 764 and 765 isolates the feedback device from the input driver during loading. The feedback device is a NAND gate, with one input given by RESETB. The outputs of the latch, QOUT, and QOUTB are set to a logical zero and a logical one, respectively, during RESETB low. The master stage is clocked by PH1, and the slave is loaded during PH2. The slave portion of the latch is identical to the master. The data latch 722 is the type of latch also used in the phase generator 420.

Figure 12:
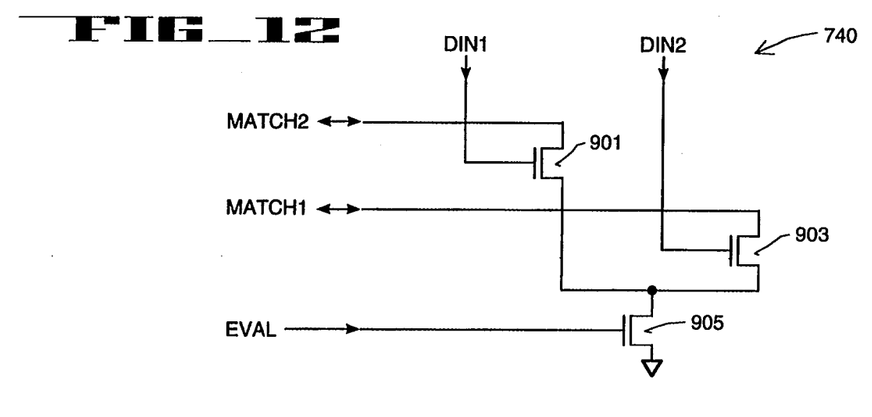
FIG. 12 is an electrical schematic of a match circuit of the stop timer.

FIG. 12 illustrates match circuit 740. Match circuit 740 is an example of one of the comparators 801 through 815 used in counter 426 of FIG. 10. Match circuit 740 is a simple wired NOR circuit used to detect a particular count out of counter 426.

The MATCH1 and MATCH2 lines are the wired NOR nodes for the program and erase count values. The EVALUATE node is clock DPH1, and the PRECHARGE node is clock DPH2. The weak pullup 927 of FIG. 13 and inverter 921 of FIG. 13 form a half latch, and that serves to hold up the MATCH node until the EVALUATE phase. The strong p device 923 of FIG. 13 acts as the precharge device that will pull the MATCH line up rapidly during the PRECHARGE phase.

During DPH2, the next count value out of the counter becomes valid, the the MATCH node is pulled to a high value. During the dead time between DPH1 and DPH2, the MATCH node is held high by the half latch (i.e., the weak p pullup and inverter on the MATCH node).

During the next DPH1, the EVALUATE n pull down is enabled (device 905 of FIG. 12.) This pull down is in series with the two parallel n devices, 903 and 901. The drain of device 903 is connected to MATCH1, while device 901 is connected to MATCH2. The gate of these devices are driven by the QOUT/QOUTB outputs of the DLAT cells that comprise the counter. This n pull down stack (905, 903, 901) is repeated for every DLAT cell. Thus, if any one of the n devices has its gate at a "1" during the EVALUATE phase, the corresponding MATCH line will be pulled low. When MATCH is low during the EVALUATE phase, this indicates that the desired count has not been reached. If during EVALUATE none of the n devices (903, 901) are on, and the MATCH node stays at a "1," then the desired count has been reached, and the "1" state of the MATCH node will be latched into a recirculating latch.

Figure 13:
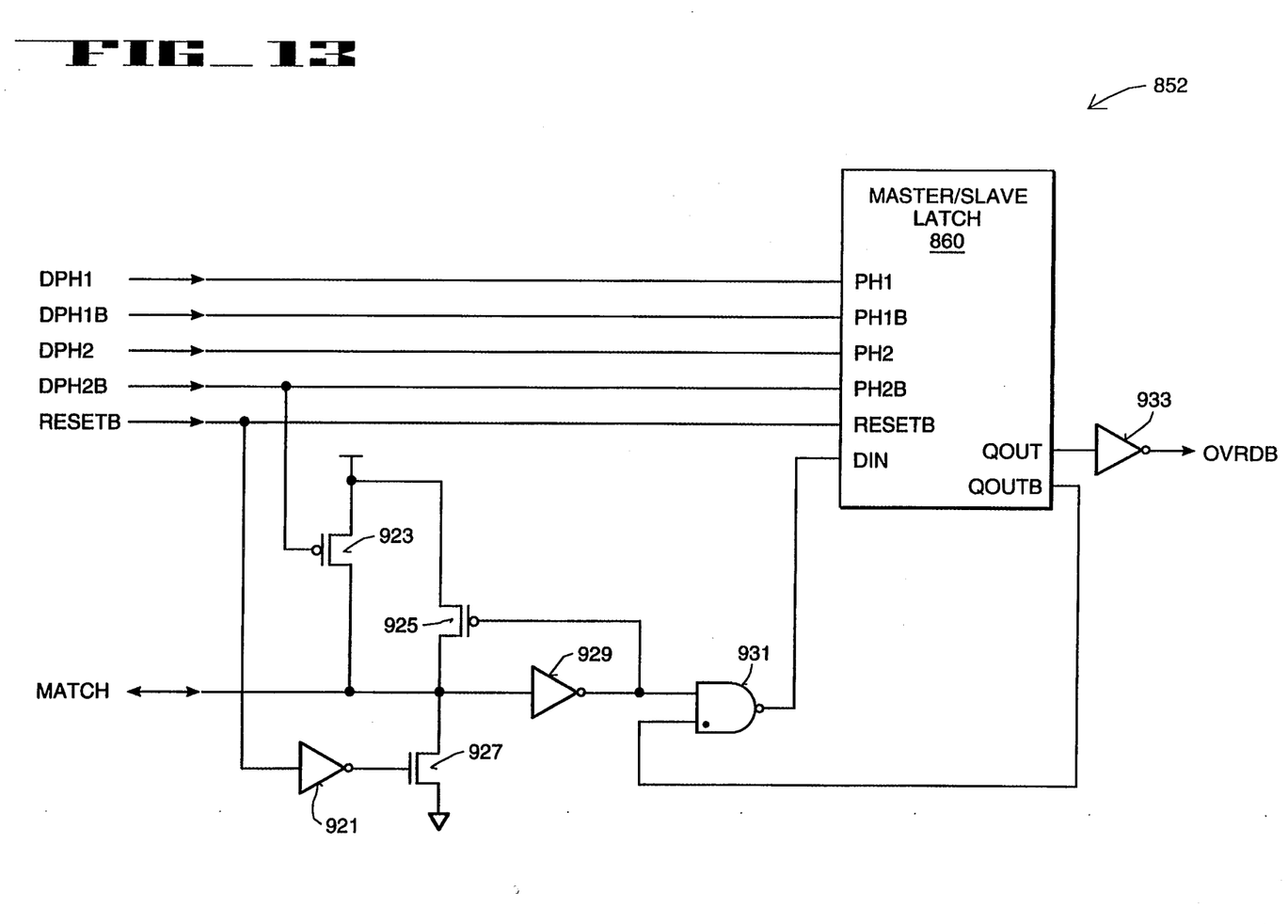
FIG. 13 is a electrical schematic override of circuitry of the stop timer.

FIG. 13 illustrates recirculating latch circuitry 852. Recirculating latch circuitry 852 is used as part of override circuits 432 and 438 of FIG. 5. The recirculating latch circuit 852 will hold the MATCH-equals-one state until RESETB is activated. The output of recirculating latches 438 and 432 are buffered and inverted, becoming the KILLPGMB signal and the KILLERSB signal, respectively.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. Override timing control circuitry for overriding a memory erase sequence controlled by an external processor, the override timing control circuitry residing on a same substrate as a memory, the memory including a plurality of data pins, the override timing control circuitry comprising:
- (a) a command register for storing a command sent by the processor to the memory via the plurality of data pins;
- (b) decode circuitry coupled to the command register for decoding the command, the decode circuitry outputting a first value if the command represents a call to initiate the memory erase sequence;
- (c) a first latch coupled to the decode circuitry for storing the first value;
- (d) an override timer coupled between the first latch and the memory, comprising:
  - (1) a counter that is initialized and begins counting when the first value is stored in the first latch; and
  - (2) circuitry responsive to the counter for generating an override signal for terminating the memory erase sequence when the counter reaches a first count; and
- (e) an erase switch for controlling the application of an erase voltage to the memory, the erase switch being responsive to the override signal.

2. The override timing control circuitry of claim 1, wherein:
- (a) the counter comprises a plurality of flip-flops; and
- (b) the circuitry responsive to the counter for generating the override signal for terminating the memory erase sequence comprises a plurality of comparators.

3. The override timing control circuitry of claim 1 wherein the memory is a flash erasable programmable read-only memory.

4. The override timing control circuitry of claim 1 further comprising:
- (a) a voltage level detector for detecting when a level of the erase voltage falls below a selected voltage level; the voltage level detector terminating the memory erase sequence by disabling the override timer when the level of the erase voltage falls below the selected voltage level.

5. A method for overriding a memory erase sequence controlled by a processor, comprising the steps of:
- (a) storing in a command register a command sent by the processor to a memory via a plurality of data pins, the command register residing on a same substrate as the memory;
- (b) decoding the command stored in the command register and outputting a first value if the command represents a call to initiate the memory erase sequence;
- (c) storing in a first latch the first value, the first latch residing on the same substrate as the memory;
- (d) initializing a counter and begin counting when the first value is stored in the first latch, the counter residing on the same substrate as the memory;
- (e) generating an override signal for terminating the memory erase sequence when the counter reaches a first count; and
- (f) disabling an erase voltage switch for coupling an erase voltage to the memory in response to the override signal.

6. The method of claim 5 further comprising the steps of:
- (a) detecting when a level of the erase voltage falls below a selected voltage level; and
- (b) overriding the memory erase sequence by disabling the counter when the level of the erase voltage falls below the selected voltage level.

7. Override timing control circuitry for overriding a memory program sequence controlled by an external processor, the override timing control circuitry residing on a same substrate as a memory, the memory including a plurality of data pins, the override timing control circuitry comprising:
- (a) a command register for storing a command sent by the processor to the memory via the plurality of data pins;
- (b) decode circuitry coupled to the command register for decoding the command, the decode circuitry outputting a first value if the command represents a call to initiate the memory program sequence;
- (c) a first latch coupled to the decode circuitry for storing the first value;
- (d) an override timer coupled between the first latch and the memory, comprising:
  - (1) a counter that is initialized and begins counting when the first value is stored in the first latch;
  - (2) circuitry responsive to the counter for generating an override signal for terminating the memory program sequence when the counter reaches a first count; and
- (e) a program switch for controlling the application of a program voltage to the memory, the program switch being responsive to the override signal.

8. The override timing control circuitry of claim 7, wherein:
- (a) the counter comprises a plurality of flip-flops;
- (b) the circuitry responsive to the counter for generating the override signal for terminating the memory program sequence comprises a plurality of comparators.

9. The override timing control circuitry of claim 7 wherein the memory is a flash erasable programmable read-only memory.

10. The override timing control circuitry of claim 7 further comprising:
- (a) a voltage level detector for detecting when a level of the program voltage falls below a selected voltage level, the voltage level detector terminating the memory program sequence by disabling the override timer when the level of the program voltage falls below the selected voltage level.

11. A method for overriding a memory program sequence controlled by a processor, comprising the steps of:
- (a) storing in a command register a command sent by the processor to a memory via a plurality of data pins, the command register residing on a same substrate as the memory;
- (b) decoding the command stored in the command register and outputting a first value when the command represents a call to initiate the memory program sequence;
- (c) storing in a first latch the first value, the first latch residing on the same substrate as the memory;
- (d) initializing a counter and begin counting when the first value is stored in the first latch, the counter residing on the same substrate as the memory;
- (e) generating an override signal for terminating the memory program sequence when the counter reaches a first count; and
- (f) disabling a program voltage switch for coupling a program voltage to the memory in response to the override signal.

12. The method of claim 11 further comprising the steps of:
- (a) detecting when a level of the program voltage falls below a selected voltage level; and
- (b) overriding the memory program sequence by disabling the counter when the level of the program voltage falls below the selected voltage level.

* * * * *